(12) United States Patent
Sterling

(10) Patent No.: US 11,943,852 B2
(45) Date of Patent: Mar. 26, 2024

(54) SYSTEM AND METHOD FOR RAILROAD SMART FLASHER LAMPS

(71) Applicant: BNSF Railway Company, Fort Worth, TX (US)

(72) Inventor: Ross Martin Sterling, Gardner, KS (US)

(73) Assignee: BNSF Railway Company, Fort Worth, TX (US)

( * ) Notice: Subject to any disclaimer, the term of this patent is extended or adjusted under 35 U.S.C. 154(b) by 217 days.

(21) Appl. No.: 17/680,016

(22) Filed: Feb. 24, 2022

(65) Prior Publication Data

US 2023/0269848 A1    Aug. 24, 2023

Related U.S. Application Data

(63) Continuation-in-part of application No. 17/679,575, filed on Feb. 24, 2022, now Pat. No. 11,510,298.

(51) Int. Cl.
*H05B 45/58* (2020.01)
*B61L 5/18* (2006.01)
(Continued)

(52) U.S. Cl.
CPC ............ *H05B 45/58* (2020.01); *B61L 5/1881* (2013.01); *G01R 31/2635* (2013.01);
(Continued)

(58) Field of Classification Search
None
See application file for complete search history.

(56) References Cited

U.S. PATENT DOCUMENTS 6,222,446 B1    4/2001  Hilleary
7,154,403 B2   12/2006  Davenport et al.
(Continued)

FOREIGN PATENT DOCUMENTS

EP    2030862 A1    3/2009
EP    2857277 A1    4/2015
(Continued)

OTHER PUBLICATIONS

Charles Z.K. Chen, Harry Hsiao, How to Make Railroad Crossings Safer and Smarter, Mar. 1, 2017.
(Continued)

*Primary Examiner* — Anh Q Tran
(74) *Attorney, Agent, or Firm* — Whitaker Chalk Swindle & Schwartz, PLLC; Enrique Sanchez, Jr.

(57) ABSTRACT

A smart lamp system and method for monitoring a status of LEDs. The system can provide LED status monitoring using a logic controller communicating with at least one strip of LEDs. The system can utilize the logic controller to assign a unique identifier (ID) to the at least one strip of LEDs based on a physical position of a plurality of dual-inline package (DIP) switches incorporated within a smart lamp housing. The system can provide a hardware architecture to interface the logic controller with a power-line communication (PLC) transceiver. The system can establish a communication protocol between the PLC transceiver and a PLC receiver to efficiently communicate the statuses of the LEDs. The logic controller can generate a payload including a binary representation of the unique ID of the smart lamp and the statuses of the LEDs and transmit the payload to the PLC transceiver.

30 Claims, 4 Drawing Sheets

(51) Int. Cl.
  *G01R 31/26* (2020.01)
  *G01R 31/44* (2020.01)
  *H05B 45/46* (2020.01)
  *H05B 45/52* (2020.01)
  *H05B 45/54* (2020.01)

(52) U.S. Cl.
  CPC ............. *G01R 31/44* (2013.01); *H05B 45/46* (2020.01); *H05B 45/52* (2020.01); *H05B 45/54* (2020.01); *B61L 2207/02* (2013.01)

(56) References Cited

U.S. PATENT DOCUMENTS

| | | | |
|---|---|---|---|
| 7,586,421 | B2 | 9/2009 | Witte et al. |
| 8,058,815 | B1 | 11/2011 | Hardy |
| 8,717,194 | B2 | 5/2014 | Nguyen et al. |
| 9,420,674 | B2 | 8/2016 | Hartman et al. |
| 9,610,959 | B2 | 4/2017 | Pless et al. |
| 10,152,881 | B2 | 12/2018 | Mubarek et al. |
| 10,477,650 | B2 | 11/2019 | Wray |
| 2007/0188427 | A1* | 8/2007 | Lys ................... H05B 45/46 345/82 |
| 2019/0185034 | A1 | 6/2019 | Smith et al. |
| 2019/0297709 | A1* | 9/2019 | Hirauchi ................ H04B 3/54 |
| 2019/0329802 | A1 | 10/2019 | Beier et al. |
| 2019/0351920 | A1 | 11/2019 | Ibarra et al. |
| 2021/0070330 | A1 | 3/2021 | McGavock, Jr. et al. |
| 2021/0086809 | A1 | 3/2021 | Honeck et al. |
| 2021/0086811 | A1 | 3/2021 | Fox et al. |
| 2021/0237785 | A1 | 8/2021 | McGavock, Jr. et al. |

FOREIGN PATENT DOCUMENTS

| | | |
|---|---|---|
| EP | 3738856 A1 | 11/2020 |
| WO | 2003067933 A1 | 8/2003 |

OTHER PUBLICATIONS

N/A, Communications and signaling equipment and warning devices., Jun. 1, 2003.

Wei-Hsun Lee and Chi-Yi Chiu, Design and Implementation of a Smart Traffic Signal Control System for Smart City Applications, Jan. 16, 2020.

Paula Fraga-Lamas , Tiago M. Fernández-Caramés and Luis Castedo, Towards the Internet of Smart Trains: A Review on Industrial IoT-Connected Railways, Jun. 21, 2017.

* cited by examiner

SYSTEM AND METHOD FOR RAILROAD SMART FLASHER LAMPS

CROSS-REFERENCE TO RELATED APPLICATIONS

The present application is a Continuation-in-Part of U.S. patent application Ser. No. 17/679,575, filed 24 Feb. 2022, the entirety of which is hereby incorporated by reference for all purposes.

TECHNICAL FIELD

The present disclosure relates generally to light-emitting diode (LED) lamps, and more particularly to a smart lamp system and method for monitoring a status of LEDs in flasher lamps.

BACKGROUND

Railway crossings are instrumental for interfacing railroads and vehicle crossings. The railway crossings provide safety for all parties involved by signaling to any motorists or pedestrians when a train is approaching the railway crossing. The Federal Railway Act (FRA) governs the minimum requirements for the railway crossing to be considered safe for the public. For example, the FRA requires the railway crossing to include greater than 50% of the lights on a mast at the railway crossing to be operational, otherwise the railway crossing fails the FRA requirements and the railway organization may be subject to any applicable fines. Several approaches exist for managing the lights along the railway crossings. For example, a current method is to use incandescent lights to illuminate the crossing. While the incandescent light can allow a technician to remotely monitor the status of the light operations, the incandescent lights are inefficient and consume vast power. Alternatively, another current method is to use LEDs. The LEDs are more energy efficient, but the limiting effect of the marginal power consumption impede the technician's ability to identify when a strip of LEDs is non-operational.

Regarding incandescent lights, the traditional incandescent crossing flashers utilize a light-out detection device (LOD) equipped with an amperage clamp that effectively measures current draw upon activation. The LOD devices available today are ineffective with LED lamps as the current draw needed to illuminate the LED nodes is much lower than the current draw needed to illuminate an incandescent bulb. Various attempts have been made to retrofit LOD devices with LED flashers with unfavorable results.

While incandescent bulbs when paired with an LOD device provide increased monitoring of a railway crossing's operation, LED lamps provide greater visibility to motorists and pedestrians approaching a highway-rail grade crossing and are favorable to use for railway crossings. Additionally, LED lamps do not utilize a filament for operation effectively providing greater lifecycles versus traditional incandescent flasher bulbs. LED lamps are a long-term solution that provide superior lumen output over a broader focal point. Unfortunately, accurate and dependable light-out detection for LED units has not been realized.

SUMMARY

The present disclosure achieves technical advantages as a smart lamp system and method for monitoring a status of LEDs. The system can provide LED status monitoring using a logic controller communicating with at least one strip of LEDs. The system can utilize the logic controller to assign a unique identifier (ID) to the at least one strip of LEDs based on a physical position of a plurality of dual-inline package (DIP) switches incorporated within a smart lamp housing. The system can provide a hardware architecture to interface the logic controller with a transceiver. The transceiver can provide receipt and transmission of data signals. In one embodiment, the transceiver can be a power-line communication (PLC) transceiver. In another embodiment, the same electrical wires used to power the smart lamp are used for communicating the statuses of the LEDs between the logic controller and the PLC transceiver. The system can establish a communication protocol between the PLC transceiver and a PLC receiver to efficiently communicate the statuses of the LEDs. For example, in response to a triggering event, the PLC transceiver can activate the logic controller to provide power to the strip of LEDs. The logic controller can generate a payload including a binary representation of the unique ID of the smart lamp and the statuses of the LEDs and transmit the payload to the PLC transceiver. The PLC transceiver can generate a message frame corresponding to the communication protocol including the payload, where the timing of the message frame can be based on a delay corresponding to the position of the DIP switches.

The present disclosure can allow the rail industry to effectively monitor the status of LED flashers without costly infrastructure changes as it will negate the need to run separate conductors from the bungalow to each crossing mast. By monitoring each flasher state, greater visibility and reduced crossing activation failures and partial activations can be achieved by proactively deploying maintenance personnel to correct any deficiencies reported by the CFMW rather than discovering issues during scheduled maintenance. The system can include a monitoring component capable of identifying whether each flasher flashes as intended, a communications component that reports status via communications over power, and a processing component that evaluates crossing flasher status and generates alarms as needed. The system will help reduce the occurrence of crossing activation failures by identifying some flasher malfunctions before multiple malfunctions combine to create an activation failure.

The present disclosure can maintain the same operating value requirements as the current options available (e.g., 9-16 VDC/VAC) which should be standardized for the internal componentry to consistently capture and report various statuses. The present disclosure can include a microprocessor-based controller (processor) installed either, within the housing of the LED flasher, or installed externally. For example, within a discreet, ruggedized housing (e.g., IP68 rated) that can attach to the two (2) non-polarity sensitive power wires, small enough to fit into the crossing flasher enclosure behind the system. In one embodiment, the micro-processor-based device can be operably coupled to a plurality of dual-inline package (DIP) switches and a microcontroller capable of various functions. In another embodiment, at least seven (7) DIP switches. The micro-controller can monitor voltage, current, and DIP switch arrangement which can establish a delay in reporting and will also relay at least the following information to a PLC device mounted within the Crossing Control House ("CCH"—hereby referred to as bungalow): DIP Switch configuration and status of 0, 1, 2, or 3. Where the statuses can indicate:

0—Both strings of LEDs inoperable (undesired state);
1—LED string A inoperable, LED string B operable (permissible state);

2—LED string A operable, LED string B inoperable (permissible state); and

3—Unit fully operational (desired state).

Accordingly, the present disclosure discloses concepts inextricably tied to computer technology such that the present disclosure provides the technological benefit of implementing power-line communications to monitor statuses of LEDs using a logic controller to generate a payload compliant with a communication protocol. The firmware of the logic controller can include custom designed firmware applications to instantiate the logic controller, control the LEDs, and efficiently time the communication between the various hardware components.

The present disclosure provides a technological solution missing from conventional systems by at least providing a method using power-line communications able to detect functionality of LEDs unseen in conventional approaches. The present disclosure transforms a physical state of the LEDs to logical values based on a state machine programmed within the logic controller corresponding to the statuses of the LEDs. The present disclosure surpasses the conventional approaches by providing an ability to monitor the statuses of LEDs previously undetectable and by providing a power consumption efficient for modern lighting solutions. The present disclosure avoids adding strain on an already overspent system by providing at least the following functionality:

Monitoring various states of LEDs using a combination of power-line communications and electrical hardware.

Providing a communication protocol to monitor the states of LEDs.

Generating an alert in response to a state of the LEDs indicating LED inoperability.

It is an object of the invention to provide a smart lamp system configured to monitor a status of LEDs. It is a further object of the invention to provide a method for monitoring a status of LEDs. It is a further object of the invention to provide a computer-implemented method for monitoring a status of LEDs. These and other objects are provided by at least the following embodiments.

In one embodiment, a smart lamp system configured to monitor a status of light-emitting diodes (LEDs) can include: a power-line communication (PLC) receiver for receiving data communication signals via power-line communications utilizing common voltage feed lines; and at least one smart lamp for controlling and monitoring statuses of at least one LED strip, including: a plurality of dual-inline package (DIP) switches for representing an identifier of the at least one LED strip; a power-line transceiver configured to transmit the statuses of the at least one LED strip and DIP switch positions to the PLC receiver via power-line communications utilizing the common voltage feed lines; a memory for storing the DIP switch positions, the statuses, and configuration enabling information; and a processor coupled to the plurality of DIP switches, the power-line transceiver, the at least one LED strip, and the memory, configured to monitor the statuses of the at least one LED strip, by performing the steps of: monitoring voltage, current, and the DIP switch positions; and transmitting a communications payload to the power-line transceiver. Wherein the PLC receiver includes at least one dual polarity terminal. Wherein the processor is further configured to perform the step of generating the communications payload based on the statuses and the DIP switch positions. Wherein the DIP switch positions correspond to a unique identifier (ID) for one of the at least one smart lamp, left or right position of the at least one smart lamp, and establishes a time delay for message transmission. Wherein the plurality of DIP switches includes at least seven DIP switches. Wherein the statuses include all LED strips are inoperable, a first LED strip is operable and a second LED strip is inoperable, the first LED strip is inoperable and the second LED strip is operable, and the first LED strip is operable and the second LED strip is operable. Wherein the processor is further configured to perform the step of assigning a smart lamp configuration based on the DIP switch positions. Wherein the processor is further configured to perform the step of identifying a status of the at least one LED strip. Wherein the processor is further configured to perform the step of detecting an activation failure.

In another embodiment, a method for monitoring a status of light-emitting diodes (LEDs) can include: representing an identifier of at least one LED strip; transmitting statuses of the at least one LED strip and dual-inline package (DIP) switch positions of a plurality of DIP switches to a power-line communication (PLC) receiver via power-line communications utilizing voltage feed lines powering a smart lamp; monitoring a voltage, a current, and the DIP switch positions; and transmitting a communications payload to the PLC receiver. Wherein the PLC receiver includes at least one dual polarity terminal. Wherein the method further comprising generating the communications payload based on the statuses and the DIP switch positions. Wherein the DIP switch positions correspond to a unique identifier (ID) of the smart lamp, left or right position of the smart lamp, and establishes a time delay for message transmission. Wherein the plurality of DIP switches includes at least seven DIP switches. Wherein the statuses include all LED strips are inoperable, a first LED strip is operable and a second LED strip is inoperable, the first LED strip is inoperable and the second LED strip is operable, and the first LED strip is operable and the second LED strip is operable. Wherein the method further comprising assigning a smart lamp configuration based on the DIP switch positions. Wherein the method further comprising identifying a status of the at least one LED strip. Wherein the method further comprising detecting an activation failure.

In another embodiment, a computer-implemented method for monitoring a status of light-emitting diodes (LEDs) can include: representing an identifier of at least one LED strip; transmitting statuses of the at least one LED strip and dual-inline package (DIP) switch positions of a plurality of DIP switches to a power-line communication (PLC) receiver via power-line communications utilizing voltage feed lines powering a smart lamp; monitoring a voltage, a current, and the DIP switch positions; and transmitting a communications payload to the PLC receiver. Wherein the PLC receiver includes at least one dual polarity terminal. Wherein the computer-implemented further comprising generating the communications payload based on the statuses and the DIP switch positions. Wherein the DIP switch positions correspond to a unique identifier (ID) of the smart lamp, left or right position of the smart lamp, and establishes a time delay for message transmission. Wherein the plurality of DIP switches includes at least seven DIP switches. Wherein the statuses include all LED strips are inoperable, a first LED strip is operable and a second LED strip is inoperable, the first LED strip is inoperable and the second LED strip is operable, and the first LED strip is operable and the second LED strip is operable. Wherein the computer-implemented further comprising assigning a smart lamp configuration based on the DIP switch positions. Wherein the computer-implemented further comprising identifying a status of the at least one LED strip. Wherein the computer-implemented further comprising detecting an activation failure.

BRIEF DESCRIPTION OF THE DRAWINGS

The present disclosure will be readily understood by the following detailed description, taken in conjunction with the accompanying drawings that illustrate, by way of example, the principles of the present disclosure. The drawings illustrate the design and utility of one or more exemplary embodiments of the present disclosure, in which like elements are referred to by like reference numbers or symbols. The objects and elements in the drawings are not necessarily drawn to scale, proportion, or precise positional relationship. Instead, emphasis is focused on illustrating the principles of the present disclosure.

DETAILED DESCRIPTION

The disclosure presented in the following written description and the various features and advantageous details thereof, are explained more fully with reference to the non-limiting examples included in the accompanying drawings and as detailed in the description, which follow. Descriptions of well-known components have been omitted to not unnecessarily obscure the principal features described herein. The examples used in the following description are intended to facilitate an understanding of the ways in which the disclosure can be implemented and practiced. A person of ordinary skill in the art would read this disclosure to mean that any suitable combination of the functionality or exemplary embodiments below could be combined to achieve the subject matter claimed. The disclosure includes either a representative number of species falling within the scope of the genus or structural features common to the members of the genus so that one of ordinary skill in the art can visualize or recognize the members of the genus. Accordingly, these examples should not be construed as limiting the scope of the claims.

Figure 1:
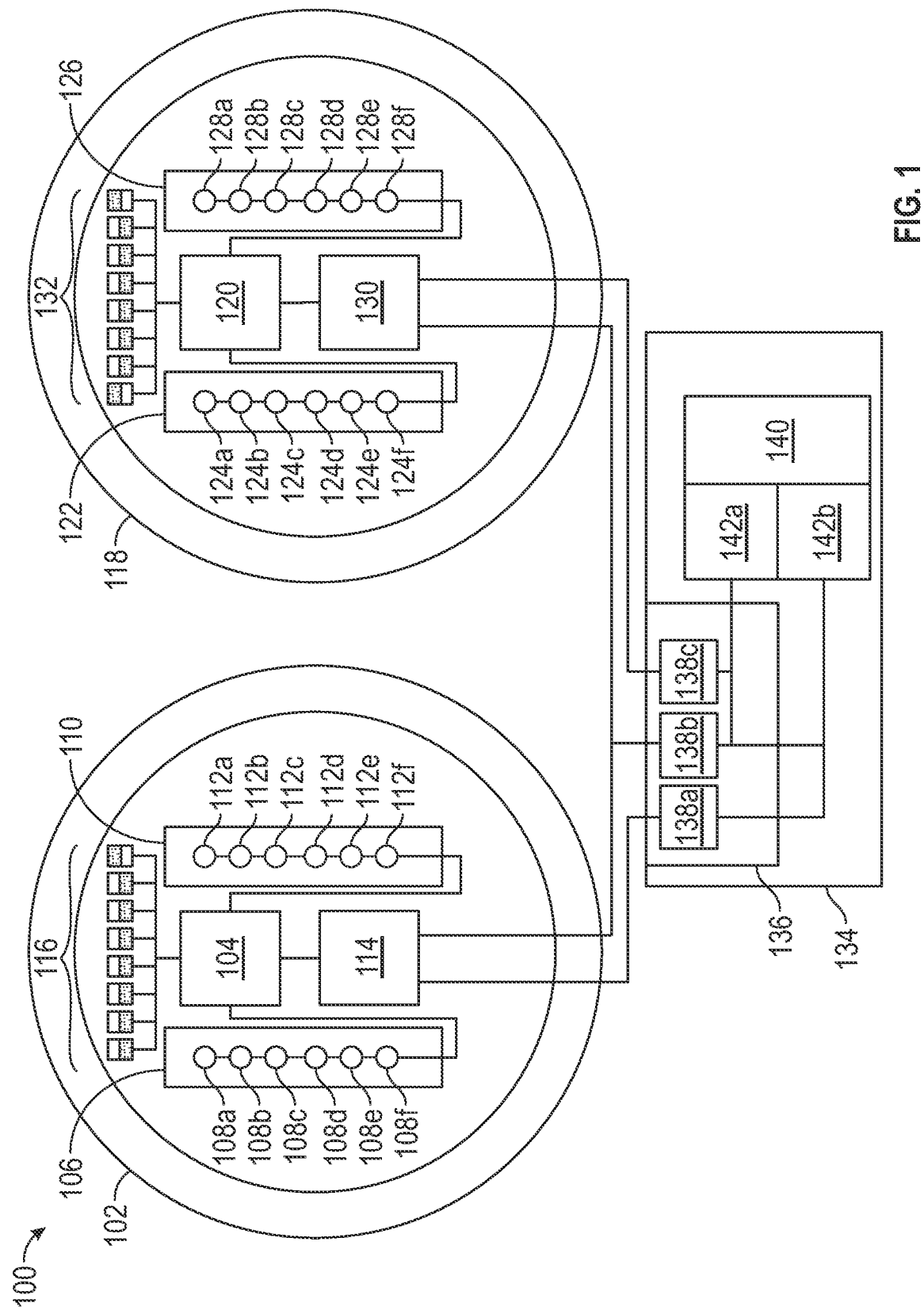
FIG. 1 illustrates a smart lamp communication system, in accordance with one or more exemplary embodiments of the present disclosure.

FIG. 1 illustrates an exemplary embodiment of a smart lamp communication system 100. The system 100 can include a first lamp component 102, a first processor 104, a first LED strip 106, a first plurality of LEDs 108a-108f, a second LED strip 110, a second plurality of LEDs 112a-112f, a first PLC transceiver 114, a first DIP switches 116, a second lamp component 118, a second processor 120, a third LED strip 122, a third plurality of LEDs 124a-124f, a fourth LED strip 126, a fourth plurality of LEDs 128a-128f, a second PLC transceiver 130, a second DIP switches 132, a signal bungalow 134 including a surge panel 136, terminals 138a-138c, a PLC receiver 140, and mast inputs 142a-142b.

The first lamp component 102, in an embodiment, can include a reflective covering to illuminate a surrounding environment. For example, the first lamp component 102 can include a reflective material sufficient for oncoming travelers to identify the system 100.

The first processor 104, in an embodiment, can include any device to perform logic processing. For example, the first processor 104 can include a microprocessor programmable to include software programs to interface and control various components of the system 100. In an example, the microprocessor can include a RASPBERRY PI, ARDUINO, or another type of microprocessor. In another example, the first processor 104 can be coupled to the first LED strip 106, the second LED strip 110, the first PLC transceiver 114, and the first DIP switches 116. In an example, the components of the system 100 can be independent of another. For example, the first processor 104 can be housed within a ruggedized housing unit independent of the first LED strip 106 and the second LED strip 110.

In another example, the first processor 104 can receive statuses of the first LED strip 106 and the second LED strip 110. For example, the statuses can indicate whether the first LED strip 106 and the second LED strip 110 are operating normally. In an example, the statuses can indicate whether the first LED strip 106 or the second LED strip 110 are inoperable. In an example, the statuses can indicate whether the first LED strip 106 and the second LED strip 110 are inoperable. The first processor 104 can generate a communication payload based on the statuses of the first LED strip 106 and the second LED strip 110. For example, the first processor 104 can include a state machine to convert the statuses to binary representation. In an example, the binary representation can be as follows.

| State | Binary | Meaning |
| --- | --- | --- |
| 0 | 00 | All LED strips are inoperable |
| 1 | 01 | The first LED string 106 is inoperable, the second LED string 110 is operable |
| 2 | 10 | The first LED string 106 is operable, the second LED string 110 is inoperable |
| 3 | 11 | The first LED string 106 is operable, the second LED string 110 is operable |

In another example, the first processor 104 can generate a communication payload corresponding to the statuses. For example, the first processor 104 can perform various protocol actions across a time window. The protocol actions can include wakeup, delay, transmission, and silence. The wakeup action can include the system 100 receives power, performs self-diagnostic checks, and prepares the system 100 for transmitting over the power line. The delay can include activation of a communication timing delay based on a position of the first DIP switches 116 and standby to transmit a message. The transmission can include an end to the delay and the system 100 transmits the ID and the statuses. The silence can include a standby to lose power when the time window ends. The time window can include a 1 second duration.

The first LED strip 106, in an embodiment, can include a housing for the first plurality of LEDs 108a-108f. For example, the first LED strip 106 can include independent structures for each of the first plurality of LEDs 108a-108f. In an example, the first LED strip 106 can include electrical hardware (not shown) to power the first LED strip 106. For example, the first LED strip 106 can receive between 9 and 16 volts (V) either alternating current (AC) or direct current (DC). In another example, the LED strip 106 can include non-polarity sensitive hardware. In another example, the first LED strip 106 can transmit statuses corresponding to the first plurality of LEDs 108a-108f to the first processor 104. For example, the statuses can include the first LED strip 106 is either operable or inoperable. The first LED strip 106 can indicate the first plurality of LEDs 108a-108f are operable when at least one of the first plurality of LEDs 108a-108f are operating normally. The first LED strip 106 can indicate the first plurality of LEDs 108a-108f are inoperable when none of the first plurality of LEDs 108a-108f are operating normally.

The first plurality of LEDs 108a-108f, in an embodiment, can include LEDs of various colors and manufacturing capabilities. For example, the first plurality of LEDs 108a-108f can include at least one LED. In an example, the first plurality of LEDs 108a-108f can each be coupled in series. In another example, the first plurality of LEDs 108a-108f can each be coupled in parallel.

The second LED strip 110, in an embodiment, can include a housing for the second plurality of LEDs 112a-112f. For example, the second LED strip 110 can include independent structures for each of the second plurality of LEDs 112a-112f. In an example, the second LED strip 110 can include electrical hardware (not shown) to power the second LED strip 110.

The second plurality of LEDs 112a-112f, in an embodiment, can include LEDs of various colors and manufacturing capabilities. For example, the second plurality of LEDs 112a-112f can include at least one LED. In an example, the second plurality of LEDs 112a-112f can each be coupled in series. In another example, the second plurality of LEDs 112a-112f can each be coupled in parallel.

The first PLC transceiver 114, in an embodiment, can transmit data on a conductive wire that is also used for power transmission. For example, the first PLC transceiver 114 can transmit statuses of the first LED strip 106 and the second LED strip 110 and positions of the first DIP switches 116 via power-line communications utilizing voltage feed lines powering the smart lamp. The voltage feed lines can include AC power transmission. In an example, the voltage feed lines can include DC power transmission and the first PLC transceiver 114 can include a converter hardware to convert the DC power for data communications (i.e., modulate the DC power corresponding to bits of the data communications). In another example, the first PLC transceiver 114 can operate by adding a modulated carrier signal to the power line. For example, the power line transmitting power to the system 100 can include the modulated carrier signal at a particular frequency. The particular frequency can include a narrowband, a low speed narrowband, and a medium speed narrowband. In an example, the narrowband can include a data rate of 20 bits per second (bit/s). For example, the narrowband can include industry standard protocols such as X10, Consumer Electronics Bus (CEBus), Local Operating Networks (LonWorks), a custom protocol, or another relevant industry standard protocol. The low speed narrowband can include a data rate of 200 to 1200 bit/s. For example, the low speed narrowband can include industry standard protocols such as IEC 61334, Open Smart Grid Protocol (OSGP), ETSI 103 908, a custom protocol, or another relevant industry standard protocol. The medium speed narrowband can include a data rate of up to 576 kilobits per second (kbit/s). For example, the medium speed narrowband can include industry standard protocols such as G3-PLC (ITU G.9903), a custom protocol, or another relevant industry standard protocol.

In an example, the first PLC transceiver 114 can include a wiring schematic coupled to the PLC receiver 134. The first PLC transceiver 114 can include a first connection and a second connection. For example, the first connection can be coupled to the terminal 138a and the second connection can be coupled to the terminal 138b. The terminal 138b can alter a polarity of a source corresponding with time. For example, for a first duration the alternating source can transmit a positive current or voltage and for a second duration the alternating source can transmit a negative current or voltage. In another example, the first PLC transceiver 114 and the first processor 104 can be included on a single printed circuit board as modules or independent devices.

The first DIP switches 116, in an embodiment, can include a manual electric switch that is packaged with others in a group in a standard dual in-line package. In an example, the first DIP switches 116 can refer to each individual switch, or to the unit as a whole. In another example, the first DIP switches 116 can be used on a printed circuit board along with other electronic components and can be used to customize the behavior of an electronic device for specific situations.

Figure 2:
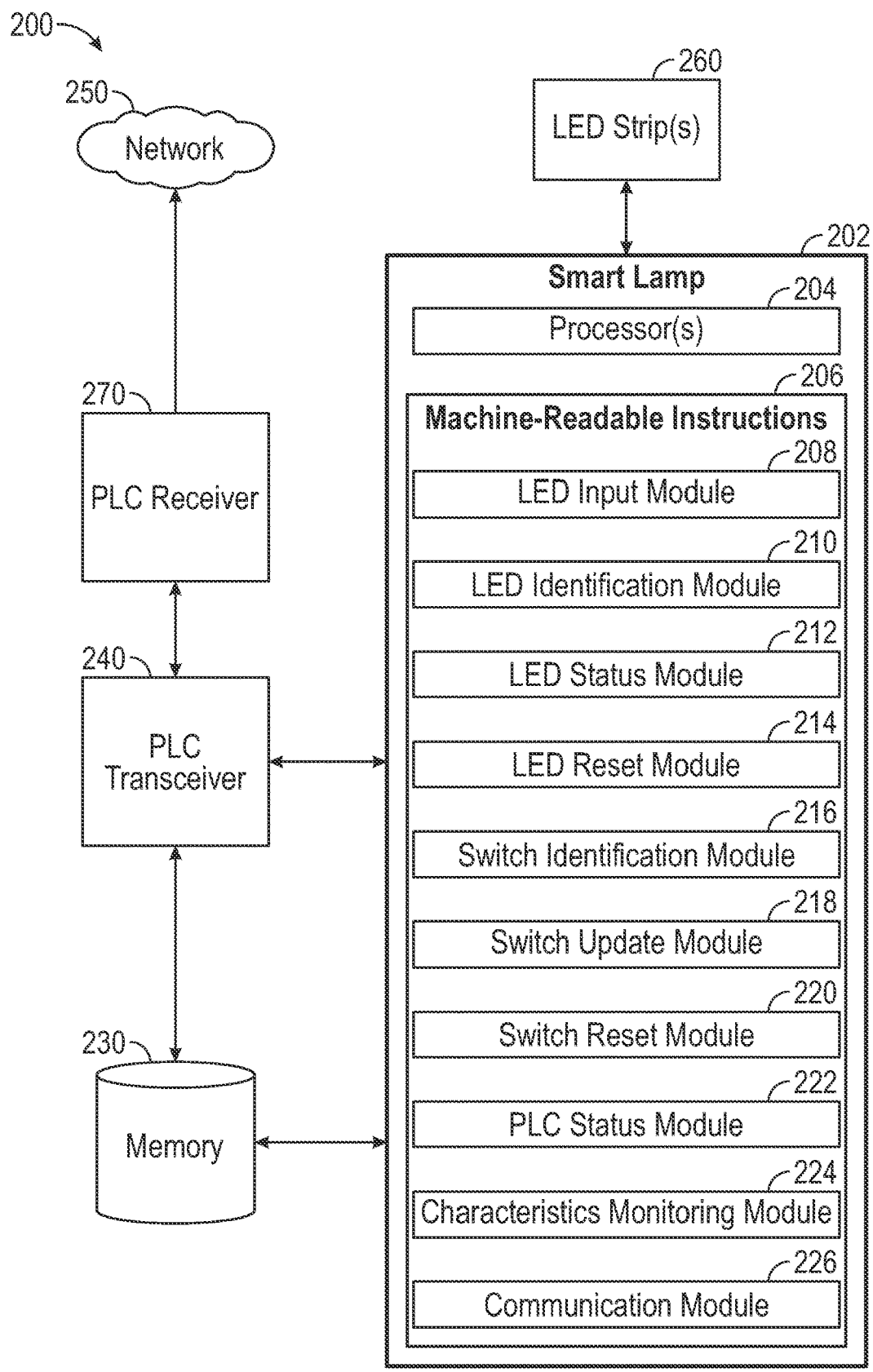
FIG. 2 illustrates a block diagram of a smart lamp system, in accordance with one or more exemplary embodiments of the present disclosure.

The first DIP switches 116, in an embodiment, can include a manual electric switch that is packaged with others in a group in a standard dual in-line package. In an example, the first DIP switches 116 can be used on a printed circuit board along with other electronic components and can be used to customize the behavior of an electronic device for specific situations. In an example, the first DIP switches 116 can represent an identifier of the first LED strip 106 and the second LED strip 110. In an example, the first DIP switches 116 can correspond to various positions. For example, the switch positions can correspond to a unique ID corresponding to the first lamp component 102. As illustrated in FIG. 2, the position of switches is represented based on a position of the white box for each of the DIP switches 116, either up or down. In another example, the first switch of the first DIP switches 116 can correspond to a physical position of the first lamp component 102. For example, the first lamp component 102 can be on a right side or a left side relative to a reference point. In an example, the first lamp component 102 on the left side of the reference point can include the first switch to be in an up position ("1") indicating a left lamp. The remaining switches can be used for a unique ID and a time delay value, which can be used for timing of communication. In an example, the first DIP switches 116 can include at least seven DIP switches.

The second lamp component 118, in an embodiment, can include a reflective covering to illuminate a surrounding environment. For example, the second lamp component 118 can include a reflective material sufficient for oncoming travelers to identify the system 100.

The second processor 120, in an embodiment, can include any device to perform logic processing. For example, the second processor 120 can include a microprocessor programmable to include software programs to interface and control various components of the system 100. In an example, the microprocessor can include a RASPBERRY PI, ARDUINO, or another type of microprocessor. In another example, the second processor 120 can be coupled to the third LED strip 122, the fourth LED strip 126, the Second PLC transceiver 130, and the plurality of second DIP switches 132. In an example, the components of the system 100 can be independent of another. For example, the second processor 120 can be housed within a ruggedized housing unit independent of the third LED strip 122 and the fourth LED strip 126.

In another example, the second processor 120 can receive statuses of the third LED strip 122 and the fourth LED strip 126. For example, the statuses can indicate whether the third LED strip 122 and the fourth LED strip 126 are operating normally. In an example, the statuses can indicate whether the third LED strip 122 or the fourth LED strip 126 are inoperable. In an example, the statuses can indicate whether the third LED strip 122 and the fourth LED strip 126 are inoperable. The second processor 120 can generate a communication payload based on the statuses of the third LED strip 122 and the fourth LED strip 126. For example, the second processor 120 can include a state machine to convert the statuses to binary representation. In an example, the binary representation can be as follows.

| State | Binary | Meaning |
| --- | --- | --- |
| 0 | 00 | Both LED strips are inoperable |
| 1 | 01 | The first LED string 106 is inoperable, the second LED string 110 is operable |
| 2 | 10 | The first LED string 106 is operable, the second LED string 110 is inoperable |
| 3 | 11 | The first LED string 106 is operable, the second LED string 110 is operable |

In another example, the second processor 120 can generate a communication payload corresponding to the statuses. For example, the second processor 120 can perform various protocol actions across a time window. The protocol actions can include wakeup, delay, transmission, and silence. The wakeup action can include the system 100 receives power, performs self-diagnostic checks, and prepares the system 100 for transmitting over the power line. The delay can include activation of a communication timing delay based on a position of the second DIP switches 132 and standby to transmit a message. The transmission can include an end to the delay and the system 100 transmits the ID and the statuses. The silence can include a standby to lose power when the time window ends. The time window can include a 1 second duration.

The third LED strip 122, in an embodiment, can include a housing for the third plurality of LEDs 124a-124f. For example, the third LED strip 122 can include independent structures for each of the third plurality of LEDs 124a-124f. In an example, the third LED strip 122 can include electrical hardware (not shown) to power the third LED strip 122. For example, the third LED strip 122 can receive between 9 and 16 volts (V) either alternating current (AC) or direct current (DC). In another example, the LED strip 106 can include non-polarity sensitive hardware. In another example, the third LED strip 122 can transmit statuses corresponding to the third plurality of LEDs 124a-124f to the second processor 120. For example, the statuses can include the third LED strip 122 is either operable or inoperable. The third LED strip 122 can indicate the third plurality of LEDs 124a-124f are operable when at least one of the third plurality of LEDs 124a-124f are operating normally. The third LED strip 122 can indicate the third plurality of LEDs 124a-124f are inoperable when none of the third plurality of LEDs 124a-124f are operating normally.

The third plurality of LEDs 124a-124f, in an embodiment, can include LEDs of various colors and manufacturing capabilities. For example, the third plurality of LEDs 124a-124f can include at least one LED. In an example, the third plurality of LEDs 124a-124f can each be coupled in series. In another example, the third plurality of LEDs 124a-124f can each be coupled in parallel.

The fourth LED strip 126, in an embodiment, can include a housing for the fourth plurality of LEDs 128a-128f. For example, the fourth LED strip 126 can include independent structures for each of the fourth plurality of LEDs 128a-128f. In an example, the fourth LED strip 126 can include electrical hardware (not shown) to power the fourth LED strip 126.

The fourth plurality of LEDs 128a-128f, in an embodiment, can include LEDs of various colors and manufacturing capabilities. For example, the fourth plurality of LEDs 128a-128f can include at least one LED. In an example, the fourth plurality of LEDs 128a-128f can each be coupled in series. In another example, the fourth plurality of LEDs 128a-128f can each be coupled in parallel.

The second PLC transceiver 130, in an embodiment, can transmit data on a conductive wire that is also used for power transmission. For example, the second PLC transceiver 130 can transmit statuses of the third LED strip 122 and the fourth LED strip 126 and positions of the second DIP switches 132 via power-line communications utilizing voltage feed lines powering the smart lamp. The voltage feed lines can include AC power transmission. In an example, the voltage feed lines can include DC power transmission and the second PLC transceiver 130 can include a converter hardware to convert the DC power for data communications (i.e., modulate the DC power corresponding to bits of the data communications). In another example, the second PLC transceiver 130 can operate by adding a modulated carrier signal to the power line. For example, the power line transmitting power to the system 100 can include the modulated carrier signal at a particular frequency. The particular frequency can include a narrowband, a low speed narrowband, and a medium speed narrowband. In an example, the narrowband can include a data rate of 20 bits per second (bit/s). For example, the narrowband can include industry standard protocols such as X10, Consumer Electronics Bus (CEBus), Local Operating Networks (LonWorks), a custom protocol, or another relevant industry standard protocol. The low speed narrowband can include a data rate of 200 to 1200 bit/s. For example, the low speed narrowband can include industry standard protocols such as IEC 61334, Open Smart Grid Protocol (OSGP), ETSI 103 908, a custom protocol, or another relevant industry standard protocol. The medium speed narrowband can include a data rate of up to 576 kilobits per second (kbit/s). For example, the medium speed narrowband can include industry standard protocols such as G3-PLC (ITU G.9903), a custom protocol, or another relevant industry standard protocol.

In an example, the second PLC transceiver 130 can include a wiring schematic coupled to the PLC receiver 134. The second PLC transceiver 130 can include a third connection and a fourth connection. For example, the third connection can be coupled to the terminal 138b and the fourth connection can be coupled to the terminal 138c. The terminal 138b can alter a polarity of a source corresponding with time. For example, for a first duration the alternating source can transmit a positive current or voltage and for a second duration the alternating source can transmit a negative current or voltage. In another example, the second PLC transceiver 130 and the second processor 120 can be included on a single printed circuit board as modules or independent devices.

The second DIP switches 132, in an embodiment, can include a manual electric switch that is packaged with others in a group in a standard dual in-line package. In an example, the second DIP switches 132 can be used on a printed circuit board along with other electronic components and can be used to customize the behavior of an electronic device for specific situations. In an example, the second DIP switches 132 can represent an identifier of the third LED strip 122 and the fourth LED strip 126. In an example, the second DIP switches 132 can correspond to various positions. For example, the switch positions can correspond to a unique ID corresponding to the second lamp component 118. As illustrated in FIG. 2, the position of the second DIP switches 132 is represented based on a position of the white box for each of the switches, either up or down. In an example, the first switch of the second DIP switches 132 can correspond to a physical position of the second lamp component 118. For example, the second lamp component 118 can be on a right side or a left side relative to a reference point. In an example, the second lamp component 118 on the right side of the reference point can include the first switch to be in a down position ("0") indicating a right lamp. The remaining switches can be used for a unique ID and a time delay value, which can be used for timing of communication. In an example, the second DIP switches 132 can include at least seven DIP switches.

The signal bungalow 134, in an embodiment, can provide a housing for the surge panel 136, terminals 138a-138c, the PLC receiver 140, and the mast inputs 142a-142b. For example, the housing can include a ruggedized material to protect the internal components from any environmental characteristics and hazards. In an example, the signal bungalow 134 can correspond to a crossing control house for a railway crossing application.

The surge panel 136, in an embodiment, can protect against power surges. For example, the power surges can include electrical signals greater than a predetermined voltage or current threshold. The surge panel 136 can ensure protection of any subsequent components from being short circuited from spikes in electrical activity. For example, the surge panel 136 can reduce the power surge to a manageable power level corresponding to an appropriate power distribution level for the subsequent electrical components. In an example, the surge panel 136 can include the terminals 138a-138c.

The terminals 138a-138c, in an embodiment, can include a connector coupling electrical hardware. For example, the terminals 138a-138c can couple the first PLC transceiver 114 and the second PLC transceiver 130 to the PLC receiver 140. The terminals 138a-138c can include a variety of types including a wire connector, butt connectors, push on terminals, ring terminals, spade terminals, hook terminals, bullet connector, pin terminals, sealed connector, a fastener, or another type of terminal relevant for the application. The terminals 138a-138c can transfer current from a power or grounding source for the application. In an example, the terminals 138a-138c can include wire terminals, creating a secure electrical connection. In another example, the terminals 138a-138c can be insulated or non-insulating.

The PLC receiver 140, in an embodiment, can receive data on a conductive wire that is also used for power transmission. For example, the power transmission can include AC power. In an example, the power transmission can include DC and the PLC receiver 140 can include a power converter to convert the DC power to AC for data communications. In another example, the PLC receiver 140 can operate by adding a modulated carrier signal to the power line. For example, the power line between the components of the system 100 can include the modulated carrier signal at a particular frequency. The particular frequency can include a narrowband, a low speed narrowband, and a medium speed narrowband. In an example, the narrowband can include a data rate of 20 bits per second (bit/s). For example, the narrowband can include industry standard protocols such as X10, Consumer Electronics Bus (CEBus), Local Operating Networks (LonWorks), a custom protocol, or another relevant industry standard protocol. The low speed narrowband can include a data rate of 200 to 1200 bit/s. For example, the low speed narrowband can include industry standard protocols such as IEC 61334, Open Smart Grid Protocol (OSGP), ETSI 103 908, a custom protocol, or another relevant industry standard protocol. The medium speed narrowband can include a data rate of up to 576 kilobits per second (kbit/s). For example, the medium speed narrowband can include industry standard protocols such as G3-PLC (ITU G.9903), a custom protocol, or another relevant industry standard protocol.

In another example, the PLC receiver 140, can receive position information from the first PLC transceiver 114 and the second PLC transceiver 130, ID information corresponding to the first DIP switches 116 and the second DIP switches 132, and statuses of the first LED strip 106, the second LED strip 110, the third LED strip 122, and the fourth LED strip 126. The position information can correspond to a relative position of each of the first lamp component 102 and the second lamp component 118. For example, when the first lamp component 102 is to the left of the second lamp component 118, the position information represents the positions of each respective component. In an example, the PLC receiver 140 can receive electrical signals from the terminals 138a-138c. The PLC receiver 140 can include at least one dual polarity terminal. For example, the terminals 138a-138c can provide power to the first PLC transceiver 114 and the second PLC transceiver 130. In an example, the terminals 138a-138c can correspond to an LXE circuit, LNE circuit, and LE circuit to provide power. The LXE can be a dedicated positive. The LNE can be a dedicated negative. The LE can include dual polarities providing a polarity swapping conductor used to provide positive energy to one component, and act as a negative to another component. In this way, the LE circuit changes polarity, the PLC receiver 140 can include terminal connections that are not polarity sensitive.

In another example, the PLC receiver 140 can correspond to a web-based graphical user interface (web GUI) allowing a technician to configure and customize the system 100 to match the application. For example, the system 100 is exemplary and can extrapolate to any number of PLC transceivers and LED strips. For example, the system 100 can illuminate a railway crossing with two smart lamps (e.g., the system 100) and the web GUI can allocate the unique IDs of the DIP switches to the PLC receiver 140 such that the PLC receiver 140 can communicate with the PLC transceivers. In an example, the web GUI can include both configurable labels (i.e. left/right) and fixed objects that are non-configurable, that can be selected (i.e. front/rear). In an example, if an object is selected, a label should be attached. In an example, the PLC receiver 140 can include the mast inputs 142a-142b. The mast inputs 142a-142b, in an embodiment, can interface the terminals 138a-138c to the PLC receiver 140.

FIG. 2 illustrates a schematic view of a smart lamp system 200, in accordance with one or more exemplary embodiments of the present disclosure. The system 200 can include a smart lamp 202 having one or more processor(s) 204, a memory 230, machine-readable instructions 206, including an LED input module 208, LED identification module 210, LED status module 212, LED reset module 214, switch identification module 216, switch update module 218, switch reset module 220, PLC status module 222, characteristics monitoring module 224, communication module 226, among other relevant modules. The smart lamp 202 can be operably coupled to a PLC transceiver 240 and at least one LED strip 260. The PLC transceiver 240 can include network architecture components such as a server, modem, router, or another type of hardware or software for communicating data to the PLC receiver 270. In another example, the PLC transceiver 240 can include an application configured to communicate with the smart lamp 202 over wired or wireless communication methods. The PLC receiver 270 can include network architecture components such as a server, modem, router, or another type of hardware or software for communicating data to the network 250. In another example, the PLC receiver 270 can include an application configured to communicate with the PLC transceiver 240 over wired or wireless communication methods. The LED strip 260 can include a housing for a plurality of LEDs.

The aforementioned system components (e.g., smart lamp 202 and PLC transceiver 240) can be communicably coupled to other smart lamp systems via the network 250, such that data can be transmitted. The network 250 can be the Internet, intranet, a Modbus communication network, or other suitable network. The data transmission can be encrypted, unencrypted, over a VPN tunnel, or other suitable communication means. The network 250 can be a WAN, LAN, PAN, or other suitable network type. The network communication between the PLC transceiver 240, smart lamp 202, or any other system component can be encrypted using PGP, Blowfish, Twofish, AES, 3DES, HTTPS, or other suitable encryption. The system 200 can be configured to provide communication via the various systems, components, and modules disclosed herein via a web GUI, an application programming interface (API), Modbus, PCI, PCI-Express, ANSI-X12, Ethernet, Wi-Fi, Bluetooth, or other suitable communication protocol or medium. Additionally, third party systems and databases can be operably coupled to the system components via the network 250.

The data transmitted to and from the components of system 200 (e.g., the smart lamp 202 and PLC transceiver 240), can include any format, including JavaScript Object Notation (JSON), TCP/IP, XML, HTML, ASCII, SMS, CSV, representational state transfer (REST), remote terminal unit (RTU), or other suitable format. The data transmission can include a variation of the foregoing formats particular for use with the Modbus protocol. The data transmission can include a message, flag, header, header properties, metadata, and/or a body, or be encapsulated and packetized by any suitable format having same.

The smart lamp 202 can be implemented in hardware, software, or a suitable combination of hardware and software therefor, and may include one or more software systems operating on one or more smart lamp 202, having one or more processor(s) 204, with access to memory 230. The smart lamp 202 can include electronic storage, one or more processors, and/or other components. The smart lamp 202 can include communication lines, power lines, connections, and/or ports to enable the exchange of information via a network (e.g., the network 250) and/or other computing platforms. The smart lamp 202 can also include a plurality of hardware, software, and/or firmware components operating together to provide the functionality attributed herein to the smart lamp 202. For example, the smart lamp 202 can be implemented in a virtual environment by a cloud of computing platforms operating together as the smart lamp 202, including Software-as-a-Service (SaaS), Infrastructure-as-a-Service (IaaS), and Platform-as-a-Service (PaaS) functionality. Additionally, the smart lamp 202 can include memory 230.

Memory 230 can include electronic storage that can include non-transitory storage media that electronically stores information. The electronic storage media of electronic storage can include one or both of system storage that can be provided integrally (e.g., substantially non-removable) with the smart lamp 202 and/or removable storage that can be removably connectable to the smart lamp 202 via, for example, a port (e.g., a USB port, a firewire port, etc.) or a drive (e.g., a disk drive, etc.). Electronic storage may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage may include one or more virtual storage resources (e.g., cloud storage, a virtual private network, and/or other virtual storage resources). The electronic storage can include a database, or public or private distributed ledger (e.g., blockchain). Electronic storage can store machine-readable instructions 206, software algorithms, control logic, data generated by processor(s), data received from server(s), data received from computing platform(s), and/or other data that can enable server(s) to function as described herein. The electronic storage can also include third-party databases accessible via the network 250.

Processor(s) 204 can be configured to provide data processing capabilities in the smart lamp 202. As such, processor(s) 204 can include one or more of a digital processor, an analog processor, a digital circuit designed to process information, an analog circuit designed to process information, a state machine, and/or other mechanisms for electronically processing information, such as FPGAs or ASICs. The processor(s) 204 can be a single entity or include a plurality of processing units. These processing units can be physically located within the same device, or processor(s) 204 can represent processing functionality of a plurality of devices or software functionality operating alone, or in concert.

The processor(s) 204 can be configured to execute machine-readable instructions 206 or machine learning modules via software, hardware, firmware, some combination of software, hardware, and/or firmware, and/or other mechanisms for configuring processing capabilities on processor(s) 204. As used herein, the term "machine-readable instructions" can refer to any component or set of components that perform the functionality attributed to the machine-readable instructions component 206. This can include one or more physical processor(s) 204 during execution of processor-readable instructions, the processor-readable instructions, circuitry, hardware, storage media, or any other components.

The smart lamp 202 can be configured with machine-readable instructions 206 having one or more functional modules and a computer-implemented method for operating the smart lamp. The machine-readable instructions 206 can be implemented on one or more smart lamp 202, having one or more processor(s) 204, with access to memory 230. The machine-readable instructions 206 can be a single networked node, or a machine cluster, which can include a distributed architecture of a plurality of networked nodes. The machine-readable instructions 206 can include control logic for implementing various functionality, as described in more detail below. The machine-readable instructions 206 can include certain functionality associated with the system 200. Additionally, the machine-readable instructions 206 can include a smart contract or multi-signature contract that can process, read, and write data to the database, distributed ledger, or blockchain.

Figure 3:
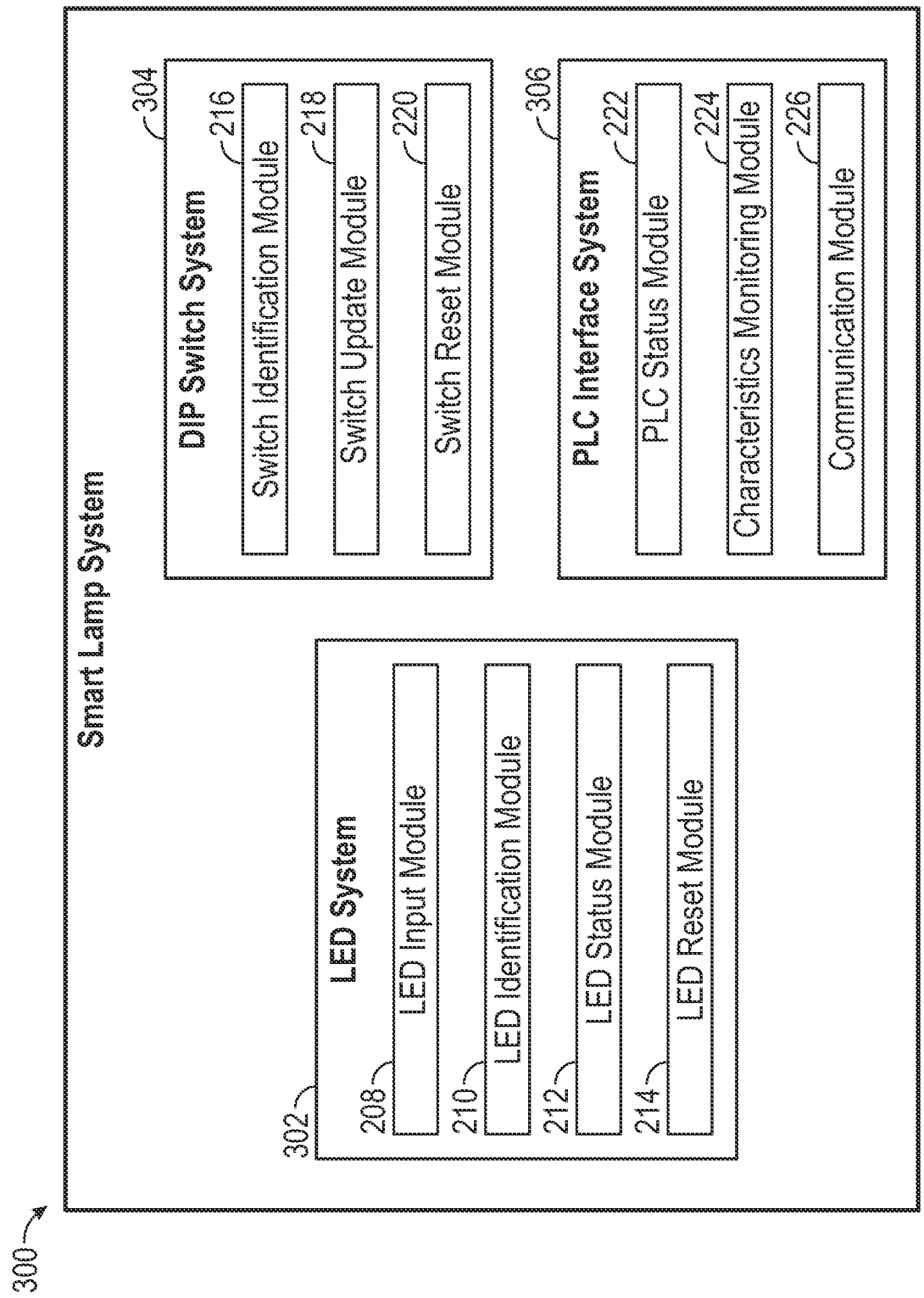
FIG. 3 illustrates a schematic view of a smart lamp system, in accordance with one or more exemplary embodiments of the present disclosure.
Figure 4:
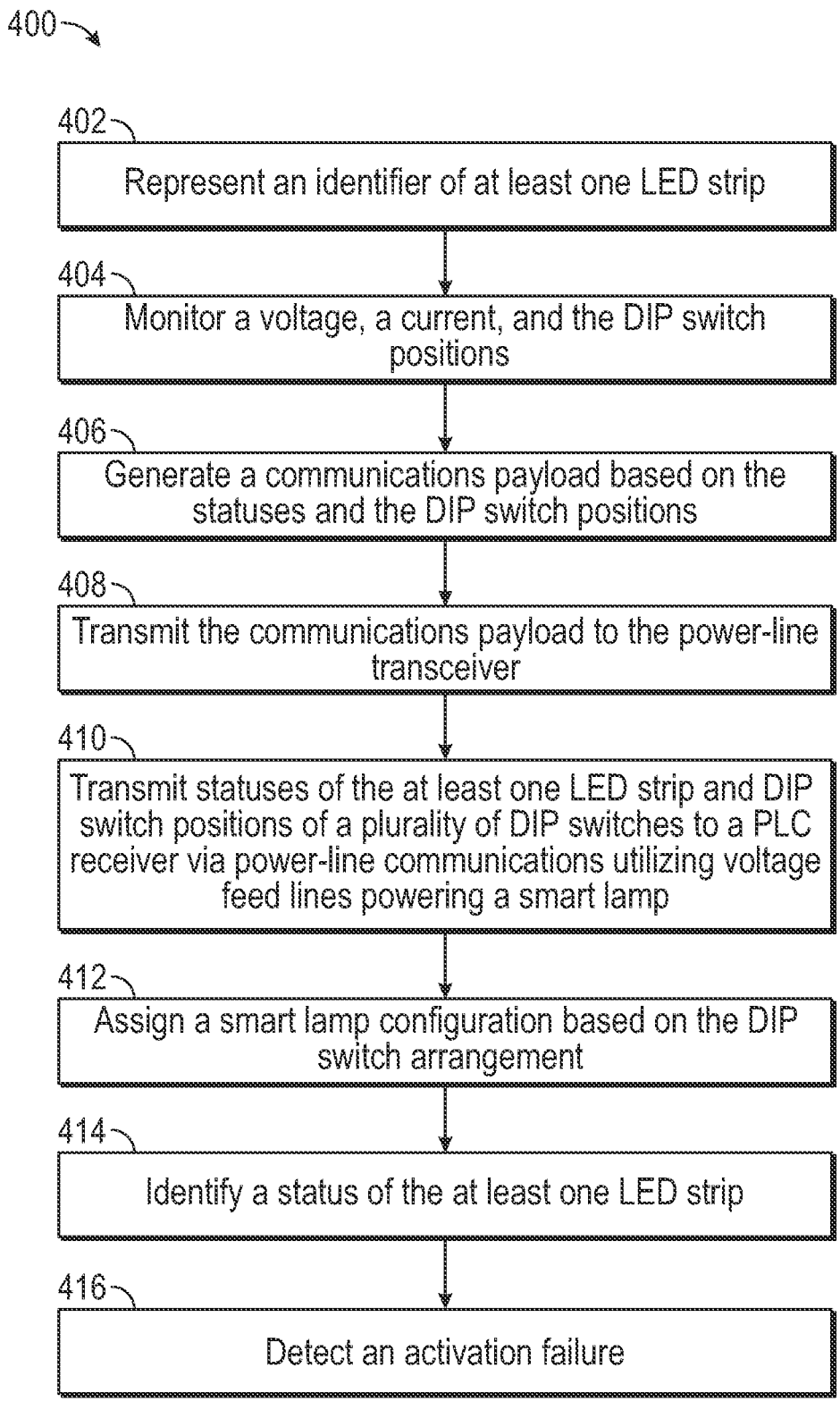
FIG. 4 illustrates a flowchart of smart lamp control logic, in accordance with one or more exemplary embodiments of the present disclosure.

FIG. 3 illustrates a schematic view of a smart lamp system 300, in accordance with one or more exemplary embodiments of the present disclosure. The system 300 can include an LED system 302, DIP switch system 304, and PLC interface system 306. Although certain exemplary embodiments may be directed to a particular hardware architecture, the system 300 can be extrapolated to be used for controlling a plurality of smart lamps in various configurations. In one embodiment, the LED system 302 can include the LED input module 208, LED identification module 210, and LED status module 212. The LED input module 208, LED identification module 210, and LED status module 212 can implement one or more algorithms to identify and monitor statuses of LEDs. The algorithms can be programmable to suit a configuration of LEDs for particular applications, such as monitoring the statuses of the LEDs for a railway crossing.

The LED input module 208, in an embodiment, can interface a processor with a strip of LEDs. For example, the processor 204 and the strip of LEDs 260 from FIG. 5. In an example, the LED input module 208 can receive electrical signals corresponding to the LED strips for a smart lamp. In an example, the LEDs can correspond to a collective electrical signal transmitted to the processor at a particular voltage. The particular voltage can correspond with a manufacturer of the LEDs. For example, a first manufacturer can provide LEDs with a threshold voltage lower than LEDs from a second manufacturer.

The LED identification module 210, in an embodiment, can identify a particular LED strip of the smart lamp. For example, the LED identification module 210 can identify the LED strip based on an LED ID corresponding to each of the LED strips. In an example, the LED identification module 210 can include LED information corresponding to the LEDs present in the smart lamp. The LED identification module 210 can compare input signals from the LEDs to the LED information to identify the LED strips.

The LED status module 212, in an embodiment, can identify a status of the LED strips. For example, the LED status module 212 can identify which of the LED strips is operational. For example, the LED status module 212 can receive inputs from each of the LED strips indicating an ID and a status of the LEDs. In an example, the LED status module 212 can identify whether the LED strip is in an inoperable state based on the inputs from the LED strips. Alternatively, the LED status module 212 can determine whether the LED strips are in an operable state. For example, the LED strips can transmit the inputs including a binary representation of the state of the LEDs. The LED status module 212 can receive the inputs and classify the LED strips based on the states of the LED strips. In an example, the LED status module 212 can identify which particular LEDs of the LED strips are inoperable.

The LED reset module 214, in an embodiment, can reset the LED strips. For example, the LED reset module 214 can restart the LED strips by transmitting a reset instruction to the LED strips. In an example, the LED reset module 214 can transmit a communication payload including a sequence of binary symbols indicating to the LED strips to reset a status. The LED reset module 214 can correspond with a physical button input from a technician. For example, if the LED strip is inoperable or transmitting an incorrect state to the LED system 302, the technician can physically press a button to reset the LED strip.

In one embodiment, the DIP switch system 304 can include the switch identification module 216, the switch update module 218, and the switch reset module 220. The LED reset module 214, the switch identification module 216, and the switch update module 218 can implement one or more algorithms to determine a state of a plurality of DIP switches in response to communicating information between the smart lamp system 300 and a PLC receiver. The algorithms and their associated thresholds and/or signatures can be programmable to uniquely suit a particular application for a plurality of smart lamps. The DIP switch system 304 can be configured to transmit and receive messages related to DIP switch positions, updates, and states from the PLC interface system 306.

The switch identification module 216, in an embodiment, can identify a current state of the DIP switches. For example, the DIP switches can correspond to various states relating to a position of the smart lamp system 300. In an example, the DIP switches can generate an electrical signal based on a mechanical position of the DIP switches, relating to the position of the smart lamp system 300. For example, when the smart lamp system 300 is positioned adjacent to another smart lamp system, the DIP switches can include a configuration representing the relative positions of the DIP switches. In an example, the DIP switches can indicate whether the smart lamp system 300 is to the left or to the right of a common reference position. The DIP switches can represent the position of the smart lamp system 300 by a position of one of the DIP switches. For example, when the smart lamp system 300 is on the left of the common reference position, one of the DIP switches can be in an up state, represented as a binary "1" in the corresponding electrical signal.

The switch update module 218, in an embodiment, can identify when an update to an arrangement of the DIP switches occurs. For example, the DIP switches can change based on an external input, such as a technician physically flipping the DIP switch. In this way, the switch update module 218 can identify when the change occurs to the DIP switches by comparing a prior state of the DIP switches with a current state of the DIP switches. In an example, the prior state of the DIP switches can be included in local memory such that it can be stored indefinitely. For example, when the smart lamp system 300 resets, compatibility between the DIP switches and the prior state can be maintained. Alternatively, when the DIP switches change, the prior state can update to a new configuration and store the current state in local memory.

The switch reset module 220, in an embodiment, can reset any stored DIP switch arrangement. For example, when the DIP switches shift the mechanical positions causing the electrical signal to include inconsistent values, the switch reset module 220 can clear any stored DIP switch arrangement such that there is no ambiguity. The switch reset module 220 can correspond to a physical button to reset the values of the DIP switches. For example, the switch reset module 220 can correspond to a physical position of the DIP switches. In an example, the DIP switch reset module 220 can reset the stored DIP switch arrangement when all the DIP switches are in an up ("1") position, or alternatively, in a down ("0") position.

In one embodiment, the PLC interface system 306 can include the PLC status module 222, the characteristics monitoring module 224, and the communication module 226. The PLC status module 222, the characteristics monitoring module 224, and the communication module 226 can implement one or more algorithms to identify whether a PLC receiver is active, monitor characteristics of the smart lamp system 300 to identify whether to generate an alert and communicate with the PLC receiver. In an embodiment, the PLC interface system 306 can monitor when the LEDs are in an inoperable state and communicate the statuses of the LEDs and DIP switch positions to the PLC receiver to identify whether action is needed for the LEDs (i.e., to repair or replace any LEDs or the smart lamp).

The PLC status module 222, in an embodiment, can identify a status of a PLC receiver. For example, the PLC receiver can be disconnected from the smart lamp system 300, resulting in no power-line communications transmitted to the smart lamp system 300. In this way, the PLC status module 222 can identify the PLC receiver is inoperable. In another example, the PLC status module 222 can identify when the PLC receiver is capable of receiving a data transmission. For example, the PLC receiver can receive data transmission when the crossing relay is active. The PLC receiver can generate a notification to the PLC status module 222 to enable communications between the two components. The PLC status module 222 can receive the notification from the PLC receiver and begin the data communication process.

The characteristics monitoring module 224, in an embodiment, can monitor various characteristics of the smart lamp system 300. For example, the characteristics monitoring module 224 can monitor voltage, current, and DIP switch arrangement of the smart lamp system 300. In an example, the characteristics monitoring module 224 can identify a value of the voltage based on power-line transmission between the PLC interface system 306 and the PLC receiver. In an example, the characteristics monitoring module 224 can assign a smart lamp configuration based on the DIP switch arrangement. For example, the DIP switch arrangement can correspond with a physical position of the smart lamp system 300 in relation to other smart lamps. In an example, the DIP switch arrangement can include a DIP switch position indicating a position of the smart lamp relative to a reference point. For example, the DIP switch position can indicate the smart lamp is to the left of the reference point, or to the right of the reference point based on the DIP switch position being up or down, respectively. The characteristics monitoring module 224 can identify a value of the current based on power-line transmission between the PLC interface system 306 and the PLC receiver. The characteristics monitoring module 224 can identify positions of the DIP switches based on the electrical signal from the DIP switches. The electrical signal can include binary representation of the positions of the DIP switches.

In another example, the characteristics monitoring module 224 can detect an activation failure. For example, the characteristics monitoring module 224 can identify a number of operational LED strips. In an example, when the number of the operational LED strips is below a threshold the characteristics monitoring can generate an alert as the activation failure. The threshold can include a ratio of the operational LED strips to a total number of LED strips. In an example, the threshold can include the ratio to be 50% of the total number of LED strips are operational. The activation failure can correspond to legal compliance with regulations for public safety. For example, the activation failure can correspond to a number of operational LED strips at a railway crossing.

The communication module 226, in an embodiment, can transmit data between the PLC interface system 306 and the PLC receiver. For example, the communication module 226 can generate a communication payload organizing the DIP switch positions and the statuses of the LED strips in a binary format. The communication module 226 can transmit the data in a time duration corresponding to a particular application. For example, the communication module 226 can transmit the data in a 1-second time window. In an example, the communication module 226 can transmit lamp information. The lamp information can include the DIP switch positions and statuses of the LED strips.

FIG. 7 illustrates a flowchart exemplifying smart lamp control logic 400, in accordance with at least one embodiment of the present disclosure. The smart lamp control logic 400 can be implemented as an algorithm on a computer processor (e.g., vital logic controller, microprocessor, RASPBERRY PI, ARDUINO, field-programmable gate array (FPGA), application-specific integrated circuit (ASIC), server, etc.), a machine learning module, or other suitable system. Additionally, the smart lamp control logic 400 can be achieved with software, hardware, firmware, a web GUI, an API, a network connection, a network transfer protocol, a Modbus communication protocol, HTML, DHTML, JavaScript, Dojo, Ruby, Rails, other suitable applications, or a suitable combination thereof. The smart lamp control logic 400 can interface electrical components to control mechanical components using logic processors.

In an embodiment, the smart lamp control logic 400 can include a plurality of DIP switches for representing an identifier of at least one LED strip. The smart lamp control logic 400 can interface the DIP switches with a power-line transceiver configured to transmit statuses of the at least one LED strip and DIP switch positions via power-line communications utilizing voltage feed lines powering the smart lamp. The smart lamp control logic 400 can further include a memory for storing the DIP switch positions, the statuses, and configuration enabling information. Additionally, the smart lamp control logic 400 can interface the memory with a processor that is configured to configured to monitor the statuses of the at least one LED strip. The smart lamp control logic 400 implementing hardware components (e.g., computer processor) can be capable of executing machine-readable instructions to perform program steps and operably coupled to a memory for storing the DIP switch positions, the statuses, and configuration enabling information.

The smart lamp control logic 400 can leverage the ability of a computer platform to spawn multiple processes and threads by processing data simultaneously. The speed and efficiency of the smart lamp control logic 400 can be greatly improved by instantiating more than one process for monitoring a status of LEDs. However, one skilled in the art of programming will appreciate that use of a single processing thread may also be utilized and is within the scope of the present disclosure. The smart lamp control logic 400 can also be distributed amongst a plurality of networked computer processors. The smart lamp control logic 400 of the present embodiment begins at step 402.

At step 402, in an embodiment, the control logic 400 can represent an identifier of at least one LED strip. For example, the control logic 400 can receive electrical signals corresponding to the LED strips for a smart lamp. In an example, the LEDs can correspond to a collective electrical signal transmitted to the processor at a particular voltage. The particular voltage can correspond with a manufacturer of the LEDs. For example, a first manufacturer can provide LEDs with a threshold voltage lower than LEDs from a second manufacturer. For example, the control logic 400 can identify the LED strip based on an LED ID corresponding to each of the LED strips. In an example, the control logic 400 can include LED information corresponding to the LEDs present in the smart lamp. The control logic 400 can compare input signals from the LEDs to the LED information to identify the LED strips. The control logic 400 then proceeds to step 404.

At step 404, in an embodiment, the control logic 400 can monitor the voltage, current, and DIP switch arrangement. For example, the control logic 400 can monitor voltage, current, and DIP switch arrangement of the smart lamp. In an example, the control logic 400 can identify a value of the voltage based on power-line transmission between the P control logic 400 and a PLC receiver. The control logic 400 can identify a value of the current based on power-line transmission between the control logic 400 and the PLC receiver. The control logic 400 can identify positions of the DIP switches based on the electrical signal from the DIP switches. The electrical signal can include binary representation of the positions of the DIP switches. The control logic 400 then proceeds to step 406.

At step 406, in an embodiment, the control logic 400 can generate a communications payload based on the statuses and the DIP switch positions. For example, the statuses can indicate whether a first LED strip and a second LED strip are operating normally. In an example, the statuses can indicate whether the first LED strip or the second LED strip are inoperable. In an example, the statuses can indicate whether the first LED strip and the second LED strip are inoperable. The control logic 400 can generate a communication payload based on the statuses of the first LED strip and the second LED strip. For example, the control logic 400 can include a state machine to convert the statuses to binary representation. In an example, the binary representation can be as follows.

| State | Binary | Meaning |
|-------|--------|---------|
| 0 | 00 | All LED strips are inoperable |
| 1 | 01 | The first LED string is inoperable, the second LED string is operable |
| 2 | 10 | The first LED string is operable, the second LED string is inoperable |
| 3 | 11 | The first LED string is operable, the second LED string is operable |

In another example, the control logic 400 can generate a communication payload corresponding to the statuses. For example, the control logic 400 can perform various protocol actions across a time window. The protocol actions can include wakeup, delay, transmission, and silence. The wakeup action can include the control logic 400 receives power, performs self-diagnostic checks, and prepares the control logic 400 for transmitting over the power line. The delay can include activation of a communication timing delay based on a position of the DIP switches and standby to transmit a message. The transmission can include an end to the delay and the control logic 400 transmits the unique ID and the statuses. The silence can include a standby to lose power when the time window ends. The time window can include a 1 second duration. The control logic 400 then proceeds to step 408.

At step 408, in an embodiment, the control logic 400 can transmit the communications payload to the power-line transceiver. For example, the communications payload can include the unique ID, DIP switch positions, and statuses of the LED strips. The control logic 400 then proceeds to step 410.

At step 410, in an embodiment, the control logic 400 can transmit statuses of the at least one LED strip and DIP switch positions via power-line communications utilizing voltage feed lines powering a smart lamp. For example, the control logic 400 can identify the status of the LED strip based on an input from the LED strip including a binary representation of the status of the LED strip. In another example, the control logic 400 can identify a current state of the DIP switches. For example, the DIP switches can correspond to various states relating to a position of the smart lamp. In an example, the DIP switches can generate an electrical signal based on a mechanical position of the DIP switches, relating to the position of the smart lamp. For example, when the smart lamp is adjacent to another smart lamp system, the DIP switches can include a configuration representing the relative positions of the DIP switches. In an example, the DIP switches can indicate whether the smart lamp is to the left or to the right of a common reference position. The DIP switches can represent the position of the smart lamp by a position of one of the DIP switches. For example, when the smart lamp is on the left of the common reference position, one of the DIP switches can be in an up state, represented as a binary "1" in the corresponding electrical signal. The control logic 400 then proceeds to step 412.

At step 412, in an embodiment, the control logic 400 can assign a smart lamp configuration based on the DIP switch arrangement. For example, the DIP switch arrangement can correspond with a physical position of the smart lamp in relation to other smart lamps. The control logic 400 then proceeds to step 414.

At step 414, in an embodiment, the control logic 400 can identify a status of the at least one LED strip. For example, the control logic 400 can identify which of the LED strips is operational. For example, the control logic 400 can receive inputs from each of the LED strips indicating an ID and a status of the LEDs. In an example, the control logic 400 can identify whether the LED strip is in an inoperable state based on the inputs from the LED strips. Alternatively, the control logic 400 can determine whether the LED strips are in an operable state. For example, the LED strips can transmit the inputs including a binary representation of the state of the LEDs. The control logic 400 can receive the inputs and classify the LED strips based on the states of the LED strips. In an example, the control logic 400 can identify which particular LEDs of the LED strips are inoperable. The control logic 400 then proceeds to step 416.

At step 416, in an embodiment, the control logic 400 can detect an activation failure. For example, the control logic 400 can identify a number of operational LED strips. In an example, when the number of the operational LED strips is below a threshold the characteristics monitoring can generate an alert as the activation failure. The threshold can include a ratio of the operational LED strips to a total number of LED strips. In an example, the threshold can include the ratio to be 50% of the total number of LED strips are operational. The activation failure can correspond to legal compliance with regulations for public safety. For example, the activation failure can correspond to a number of operational LED strips at a railway crossing.

The present disclosure achieves at least the following advantages:

1. Providing a lighting system with the ability to monitor various states of LEDs using a combination of power-line communications and electrical hardware.

2. Enabling efficient communications between the lighting system and a network using a communication protocol to monitor the states of LEDs.

3. Minimizing light failures by generating an alert in response to a state of the LEDs indicating LED inoperability.

Persons skilled in the art will readily understand that advantages and objectives described above would not be possible without the particular combination of computer hardware and other structural components and mechanisms assembled in this inventive system and described herein. Additionally, the algorithms, methods, and processes disclosed herein improve and transform any general-purpose computer or processor disclosed in this specification and drawings into a special purpose computer programmed to perform the disclosed algorithms, methods, and processes to achieve the aforementioned functionality, advantages, and objectives. It will be further understood that a variety of programming tools, known to persons skilled in the art, are available for generating and implementing the features and operations described in the foregoing. Moreover, the particular choice of programming tool(s) may be governed by the specific objectives and constraints placed on the implementation selected for realizing the concepts set forth herein and in the appended claims.

The description in this patent document should not be read as implying that any particular element, step, or function can be an essential or critical element that must be included in the claim scope. Also, none of the claims can be intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim can be understood and intended to refer to structures known to those skilled in the relevant art, as further modified or enhanced by the features of the claims themselves, and can be not intended to invoke 35 U.S.C. § 112(f). Even under the broadest reasonable interpretation, in light of this paragraph of this specification, the claims are not intended to invoke 35 U.S.C. § 112(f) absent the specific language described above.

The disclosure may be embodied in other specific forms without departing from the spirit or essential characteristics thereof. For example, each of the new structures described herein, may be modified to suit particular local variations or requirements while retaining their basic configurations or structural relationships with each other or while performing the same or similar functions described herein. The present embodiments are therefore to be considered in all respects as illustrative and not restrictive. Accordingly, the scope of the inventions can be established by the appended claims rather than by the foregoing description. All changes which come within the meaning and range of equivalency of the claims are therefore intended to be embraced therein. Further, the individual elements of the claims are not well-understood, routine, or conventional. Instead, the claims are directed to the unconventional inventive concept described in the specification.

What is claimed is:

1. A smart lamp system configured to monitor a status of light-emitting diodes (LEDs) can include:
    a power-line communication (PLC) receiver for receiving data communication signals via power-line communications utilizing common voltage feed lines; and
    at least one smart lamp for controlling and monitoring statuses of at least one LED strip, including:
        a plurality of dual-inline package (DIP) switches for representing an identifier of the at least one LED strip;
        a power-line transceiver configured to transmit the statuses of the at least one LED strip and DIP switch positions to the PLC receiver via power-line communications utilizing the common voltage feed lines;
        a memory for storing the DIP switch positions, the statuses, and configuration enabling information; and
        a processor coupled to the plurality of DIP switches, the power-line transceiver, the at least one LED strip, and the memory, configured to monitor the statuses of the at least one LED strip, by performing the steps of:
            monitoring voltage, current, and the DIP switch positions; and
            transmitting a communications payload to the power-line transceiver.

2. The smart lamp system of claim 1, wherein the PLC receiver includes at least one dual polarity terminal.

3. The smart lamp system of claim 1, wherein the processor is further configured to perform the step of generating the communications payload based on the statuses and the DIP switch positions.

4. The smart lamp system of claim 1, wherein the DIP switch positions correspond to a unique identifier (ID) for one of the at least one smart lamp, left or right position of the at least one smart lamp, and establishes a time delay for message transmission.

5. The smart lamp system of claim 1, wherein the plurality of DIP switches includes at least seven DIP switches.

6. The smart lamp system of claim 1, wherein the statuses include all LED strips are inoperable, a first LED strip is operable and a second LED strip is inoperable, the first LED strip is inoperable and the second LED strip is operable, and the first LED strip is operable and the second LED strip is operable.

7. The smart lamp system of claim 1, wherein the processor is further configured to perform the step of assigning a smart lamp configuration based on the DIP switch positions.

8. The smart lamp system of claim 1, wherein the processor is further configured to perform the step of identifying a status of the at least one LED strip.

9. The smart lamp system of claim 1, wherein the processor is further configured to perform the step of detecting an activation failure.

10. A method for monitoring a status of light-emitting diodes (LEDs) can include:
    representing an identifier of at least one LED strip;
    transmitting statuses of the at least one LED strip and dual-inline package (DIP) switch positions of a plurality of DIP switches to a power-line communication (PLC) receiver via power-line communications utilizing voltage feed lines powering a smart lamp;
    monitoring a voltage, a current, and the DIP switch positions; and
    transmitting a communications payload to the PLC receiver.

11. The method of claim 10, wherein the PLC receiver includes at least one dual polarity terminal.

12. The method of claim 10, further comprising generating the communications payload based on the statuses and the DIP switch positions.

13. The method of claim 10, wherein the DIP switch positions correspond to a unique identifier (ID) of the smart lamp, left or right position of the smart lamp, and establishes a time delay for message transmission.

14. The method of claim 10, wherein the plurality of DIP switches includes at least seven DIP switches.

15. The method of claim 10, wherein the statuses include all LED strips are inoperable, a first LED strip is operable and a second LED strip is inoperable, the first LED strip is inoperable and the second LED strip is operable, and the first LED strip is operable and the second LED strip is operable.

16. The method of claim 10, further comprising assigning a smart lamp configuration based on the DIP switch positions.

17. The method of claim 10, further comprising identifying a status of the at least one LED strip.

18. The method of claim 10, further comprising detecting an activation failure.

19. A computer-implemented method for monitoring a status of light-emitting diodes (LEDs) can include:
representing an identifier of at least one LED strip;
transmitting statuses of the at least one LED strip and dual-inline package (DIP) switch positions of a plurality of DIP switches to a wayside device utilizing voltage feed lines powering a smart lamp;
monitoring a voltage, a current, and the DIP switch positions; and
generating an alert in response to a state of the LEDs indicating LED inoperability.

20. The computer-implemented method of claim 19, further comprising a power-line communication (PLC) receiver includes at least one dual polarity terminal.

21. The computer-implemented method of claim 19, further comprising generating the communications payload based on the statuses and the DIP switch positions.

22. The computer-implemented method of claim 19, wherein the DIP switch positions correspond to a unique identifier (ID) of the smart lamp, left or right position of the smart lamp, and establishes a time delay for message transmission.

23. The computer-implemented method of claim 19, wherein the plurality of DIP switches includes at least seven DIP switches.

24. The computer-implemented method of claim 19, wherein the statuses include all LED strips are inoperable, a first LED strip is operable and a second LED strip is inoperable, the first LED strip is inoperable and the second LED strip is operable, and the first LED strip is operable and the second LED strip is operable.

25. The computer-implemented method of claim 19, further comprising assigning a smart lamp configuration based on the DIP switch positions.

26. The computer-implemented method of claim 19, further comprising identifying a status of the at least one LED strip.

27. The computer-implemented method of claim 19, further comprising detecting an activation failure.

28. A smart flasher system configured to monitor the status of LED flashers, comprising:
a processor operably coupled to at least one LED strip;
a plurality of dual-inline package (DIP) switches operably coupled to the processor; and
a transceiver configured to transmit statuses and DIP switch positions to a wayside device,
wherein the processor can generate an alert in response to the statuses indicating LED inoperability.

29. The smart flasher system of claim 22, wherein the processor monitors the voltage, current, and DIP switch arrangement and transmits flasher information to the wayside device.

30. The smart flasher system of claim 22, wherein the DIP switch position sets a unique identification number.

* * * * *